United States Patent
Kodama

(10) Patent No.: US 7,940,139 B2
(45) Date of Patent: May 10, 2011

(54) VOLTAGE-CONTROLLED OSCILLATOR, FREQUENCY SYNTHESIZER, AND OSCILLATION FREQUENCY CONTROL METHOD

(75) Inventor: Hiroshi Kodama, Tokyo (JP)

(73) Assignee: NEC Corporation, Tokyo (JP)

( * ) Notice: Subject to any disclaimer, the term of this patent is extended or adjusted under 35 U.S.C. 154(b) by 177 days.

(21) Appl. No.: 12/377,204

(22) PCT Filed: Jul. 19, 2007

(86) PCT No.: PCT/JP2007/064242
§ 371 (c)(1),
(2), (4) Date: Feb. 11, 2009

(87) PCT Pub. No.: WO2008/018276
PCT Pub. Date: Feb. 14, 2008

(65) Prior Publication Data
US 2010/0176888 A1    Jul. 15, 2010

(30) Foreign Application Priority Data
Aug. 11, 2006   (JP) .................. 2006-219789

(51) Int. Cl.
H03B 5/00 (2006.01)
H03B 5/02 (2006.01)
H03L 7/06 (2006.01)
H03L 7/07 (2006.01)
H03L 7/099 (2006.01)
H03L 7/18 (2006.01)

(52) U.S. Cl. ............... 331/177 R; 331/2; 331/8; 331/16; 331/18; 331/25; 331/49; 331/177 V; 331/179

(58) Field of Classification Search ................. 331/1 A, 331/2, 8, 15–18, 25, 34, 36 R, 36 C, 36 L, 331/49, 57, 175, 177 R, 177 V, 179; 327/146–150
See application file for complete search history.

(56) References Cited

U.S. PATENT DOCUMENTS

| | | | |
|---|---|---|---|
| 5,072,197 A | 12/1991 | Anderson | |
| 5,107,227 A | 4/1992 | Brooks | |
| 5,270,669 A | 12/1993 | Jokura | |
| 6,229,399 B1 * | 5/2001 | Tobise et al. | 331/17 |
| 7,036,032 B2 * | 4/2006 | Mizuyabu et al. | 713/323 |

FOREIGN PATENT DOCUMENTS

| | | |
|---|---|---|
| JP | 3-501912 | 4/1991 |
| JP | 3-235512 | 10/1991 |
| JP | 4-259986 | 9/1992 |
| JP | 4-304708 | 10/1992 |
| JP | 5-37435 | 2/1993 |
| JP | 9-275332 | 10/1997 |
| JP | 2003-069390 | 3/2003 |
| JP | 2004-129208 | 4/2004 |

* cited by examiner

*Primary Examiner* — David Mis
(74) *Attorney, Agent, or Firm* — Young & Thompson

(57) ABSTRACT

In a voltage-controlled oscillator capable of broadening a variable frequency range while suppressing increase of conversion gain, a converter (12) converts an input voltage to a first physical quantity, a variable converter (13) supplies a second physical quantity that accords with the status of each switch of a switch group (13a). another variable converter (14), when the input voltage is contained within a prescribed voltage range, supplies a third physical quantity that accords with the input voltage and the status of each switch of another switch group (14a), and a variable-frequency oscillator (15) supplies a signal of a frequency that accords with the first physical quantity, the second physical quantity, and the third physical quantity.

23 Claims, 9 Drawing Sheets

Fig.12
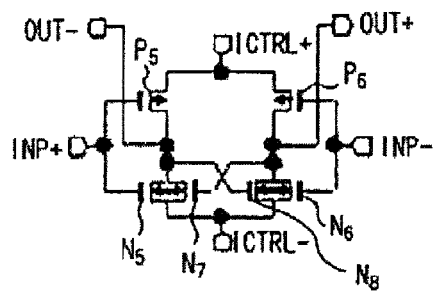
Fig.13
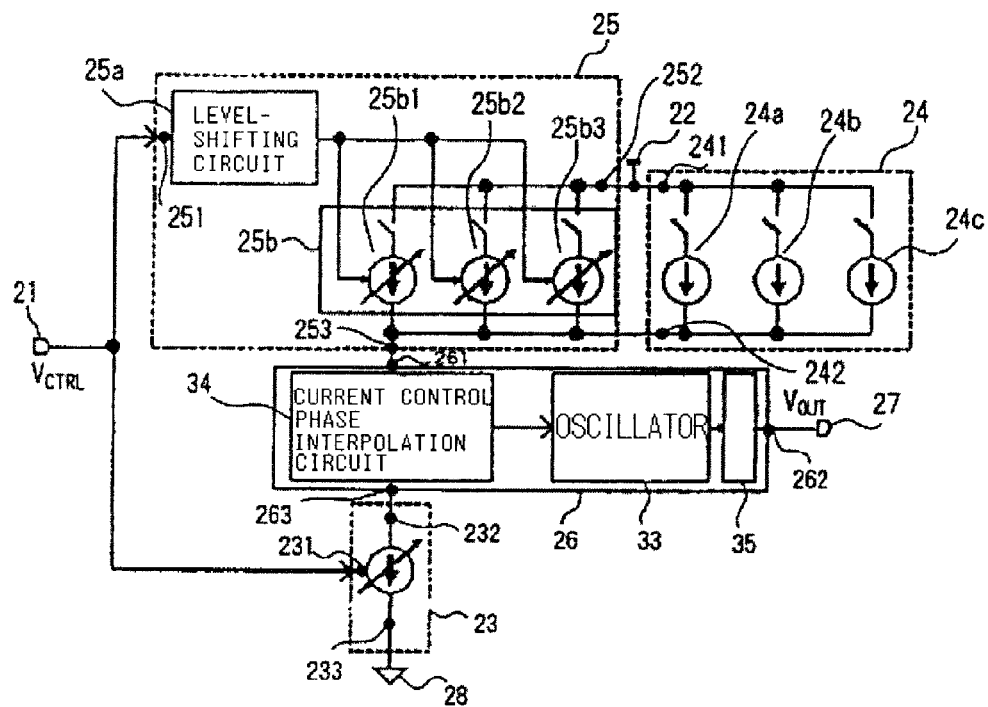
Fig.14

VOLTAGE-CONTROLLED OSCILLATOR, FREQUENCY SYNTHESIZER, AND OSCILLATION FREQUENCY CONTROL METHOD

CROSS-REFERENCES TO RELATED APPLICATIONS

This application claims the priority based on Japanese Patent Application 2006-219789 for which application was submitted Aug. 11, 2006 and incorporates all of the disclosures of that application.

TECHNICAL FIELD

The present invention relates to a voltage-controlled oscillator, a frequency synthesizer, and an oscillation frequency control method for varying oscillation frequency in a broad bandwidth.

BACKGROUND ART

Voltage-controlled oscillators that supply a signal of a frequency that accords with the input voltage are used in, for example, PLL circuits (phase-locked-loop circuits) or frequency synthesizers that implement high-speed transition (hopping) of frequency and that feature compact size and low spurious power.

FIG. 1 is a block diagram showing the configuration of a voltage-controlled oscillator of the related art. In FIG. 1, the voltage-controlled oscillator includes input terminal 1, voltage/current converters 2 and 3, current-controlled oscillator 4, and output terminal 5.

Voltage/current converters 2 and 3 convert the input voltage that is applied to input terminal 1 to a current that accords with this input voltage. Current-controlled oscillator 4 generates a signal of a frequency that accords with the sum of the currents that were converted in each of voltage/current converters 2 and 3.

Voltage/current converters 2 and 3 are each subjected to control such that the input/output characteristic of the voltage-controlled oscillator is linear. For example, when the conversion gain of voltage/current converter 2 is reduced, voltage/current converter 3 is subjected to control such that its own conversion gain increases.

In this way, the frequency range (hereinbelow referred to as the "variable frequency range") in which the input/output characteristic of the voltage-controlled oscillator is linear can be broadened.

In a voltage-controlled oscillator of this type, however, there is one input/output characteristic, and phase noise therefore increases. This problem occurs because, in order for a voltage-controlled oscillator having a single input/output characteristic to obtain the same variable frequency range as a voltage-controlled oscillator having a plurality of input/output characteristics, the conversion gain of the voltage-controlled oscillator must be increased.

Patent Document 1 (JP-A-2003-69390) discloses a PLL circuit that is provided with voltage-controlled oscillator in which the input/output characteristic is linear in the variable range of the input voltage. Normally, the input/output characteristic is not linear when the input voltage approaches the power-supply voltage that controls the operation of the voltage/current converter. In the voltage-controlled oscillator described in Patent Document 1, the input/output characteristic can be made linear and the variable frequency range can be broadened even when this input voltage approaches the power-supply voltage.

More specifically, in this voltage-controlled oscillator, the input voltage is converted to current in a voltage/current conversion circuit that operates at a second power-supply voltage that has a high voltage value. This current is supplied by way of a first and second current-mirror circuit that operate at the second power-supply voltage to a third current-mirror circuit that operates at a first power-supply voltage that is lower than the second power-supply voltage and a plurality of first transistor gates for controlling current to a ring oscillator.

In this way, the variable frequency range can be broadened even when increase in the conversion gain of the voltage-controlled oscillator is not increased.

Patent Document 1: JP-A-2003-69390

DISCLOSURE OF THE INVENTION

Problem to be Solved by the Invention

The voltage-controlled oscillator of the PLL circuit described in Patent Document 1 has only one input/output characteristic. As a result, gain of the voltage-controlled oscillator must be made large in order to obtain a signal of a frequency having a broader variable frequency range in the variable range of the input voltage. In this voltage-controlled oscillator, moreover, the variable frequency range is altered by providing a constant-current source. Nevertheless, the variable frequency range is merely altered and not broadened.

It is an object of the present invention to provide a voltage-controlled oscillator, a frequency synthesizer, and a oscillation frequency control method that enable broadening of the variable frequency range while suppressing increase in conversion gain.

Means for Solving the Problem

The voltage-controlled oscillator of the present invention for achieving the above-described object is a voltage-controlled oscillator that supplies a signal of a frequency that accords with the input voltage, a converter for converting the input voltage to a first physical quantity that accords with the input voltage; an offset adjustment unit that includes a plurality of first switches for offsetting the frequency, the offset adjustment unit being provided for generating a second physical quantity that accords with the status of each first switch; a linear adjustment unit that includes a plurality of second switches for implementing linear adjustment of the relation between the input voltage and the frequency, the linear adjustment unit being provided for, when the input voltage is contained within a prescribed voltage range for implementing linear adjustment of the relation of the input voltage and the frequency, generating a third physical quantity that accords with the input voltage and the status of each second switch; and a signal output unit for supplying a signal of a frequency that accords with the first physical quantity, the second physical quantity, and the third physical quantity.

The oscillation frequency control method of the present invention is a method of controlling oscillation frequency that is carried out by a voltage-controlled oscillator that includes a plurality of first switches for offsetting frequency that accords with the input voltage and a plurality of second switches for implementing linear adjustment of the relation between the input voltage and the frequency and that supplies a signal of the frequency; the oscillation frequency control method including: a conversion step of converting the input voltage to a first physical quantity that accords with the input voltage; an offset adjustment step of generating a second physical quantity that accords with the status of each first switch; a linear adjustment step of generating a third physical quantity that accords with the input voltage and the status of each second switch when the input voltage is contained within a prescribed voltage range for linear adjustment of the relation between the input voltage and the frequency; and a signal output step of supplying a signal of a frequency that accords with the first physical quantity, the second physical quantity, and the third physical quantity.

The voltage-controlled oscillator of the present invention is a voltage-controlled oscillator for supplying a signal of a frequency that accords with an input voltage, the voltage-controlled oscillator including: a converter for converting the input voltage to a first physical quantity that accords with the input voltage; an offset adjustment unit that includes a plurality of first switches for offsetting the frequency, the offset adjustment unit being provided for generating a second physical quantity that accords with the status of each first switch; a linear adjustment unit that includes a generation circuit for generating a status value for implementing linear adjustment of the relation of the input voltage and the frequency, the linear adjustment unit being provided for generating a third physical quantity that accords with the input voltage and the status value when the input voltage is contained in a prescribed voltage range for implementing linear adjustment of the relation between the input voltage and the frequency; and a signal output unit for supplying a signal of a frequency that accords with the first physical quantity, the second physical quantity, and the third physical quantity.

The oscillation frequency control method of the present invention is a method of controlling oscillation frequency that is carried out by a voltage-controlled oscillator that includes a plurality of first switches for offsetting frequency that accords with the input voltage and a plurality of second switches for implementing linear adjustment of the relation between the input voltage and the frequency and that supplies a signal of the frequency; the oscillation frequency control method including: a conversion step of converting the input voltage to a first physical quantity that accords with the input voltage; an offset adjustment step of generating a second physical quantity that accords with the status of each first switch; a linear adjustment step of generating a third physical quantity that accords with the input voltage and the status of each second switch when the input voltage is contained in a prescribed voltage range for implementing linear adjustment of the relation of the input voltage and the frequency; and a signal output step of supplying a signal of a frequency that accords with the first physical quantity, the second physical quantity, and the third physical quantity.

According to the above-described invention, an input voltage is converted to a first physical quantity that accords with the input voltage. In addition, a second physical quantity is generated that accords with the status of a plurality of first switches for offsetting frequency. In addition, a third physical quantity is generated when the input voltage is contained within a prescribed voltage range for implementing linear adjustment of the relation between the input voltage and frequency.

As a result, alteration of the status of the first switches enables alteration of the relation of the input voltage and frequency and enables a plurality of settings of the input/output characteristics of the voltage-controlled oscillator. In addition, regarding each input/output characteristic, the linear adjustment of the relation between the input voltage and frequency by the third physical quantity enables a broadening of the range within which each input/output characteristic is linear. Accordingly, the variable frequency range can be broadened while suppressing on increase in conversion gain.

In addition, a switch control circuit is preferably included for controlling each second switch based on the input voltage and the signal.

The frequency that accords with the input voltage varies due to, for example, temperature, ambient fluctuations of the power-supply voltage, and the secular change of the various devices, and designers of voltage-controlled oscillators therefore face difficulties in some cases in predicting a third physical quantity that will realize linear input/output characteristics.

According to the above-described invention, each second switch is controlled based on the input voltage and the signal. As a result, if each second switch is controlled to generate a third physical quantity for realizing linearity of the input/output characteristics of the voltage-controlled oscillator, the range of linearity of each input/output characteristic can be broadened even when it is difficult to predict a third physical quantity for realizing linearity of each input/output characteristic.

In addition, a switch control circuit is preferably provided for controlling each second switch based on the input voltage, the first physical quantity, the second physical quantity, and the third physical quantity.

According to the above-described invention, each second switch is controlled based on the input voltage, the first physical quantity, the second physical quantity, and the third physical quantity. Thus, if each second switch is controlled to generate a third physical quantity for realizing linearity of the input/output characteristics of the voltage-controlled oscillator, the range of linearity of each input/output characteristic can be broadened even when it is difficult to predict a third physical quantity that will realize linearity of each input/output characteristic.

In addition, the first physical quantity is preferably a first current, the second physical quantity is preferably a second current, and the third physical quantity is preferably a third current.

The linear adjustment unit preferably includes: a level-shifting circuit for lowering the input voltage by a prescribed value to generate a level-shifted voltage, and an output circuit for generating the third current when the level-shifted voltage is contained within a specific voltage range obtained by lowering the prescribed voltage range by the prescribed value.

When the third current is generated by converting voltage to current, when MOS transistors are used as the linear adjustment unit and converter, the value of voltage by which the conversion gain of the converter changes must be identical to the threshold value of the MOS transistors used in the linear adjustment unit, but providing this type of MOS transistors is in some cases problematic.

According to the above-described invention, a level-shifted voltage is generated in which the input voltage is lowered by a prescribed value. In addition, the third physical quantity is generated when this level-shifted voltage is contained within a specific voltage range obtained by lowering the prescribed voltage range by a prescribed value.

As a result, if the difference between the value of the voltage by which conversion gain of the current changes and the threshold value of MOS transistors used in the linear adjustment unit is set as the prescribed value, the third physical quantity can be easily generated when the input voltage is contained within the prescribed voltage range.

A shift control circuit is further preferably included for controlling the prescribed value based on the input voltage and the signal.

The range of input voltage for which the input/output characteristics of the voltage-controlled oscillator do not become linear changes according to temperature, ambient fluctuations of the power-supply voltage, and secular change of the various devices. As a result, prediction of an appropriate prescribed value is in some cases problematic.

According to the above-described invention, the prescribed value is controlled based on the input voltage and the signal. As a result, the range within which linearity of the input/output characteristics of the voltage-controlled oscillator can be broadened is difficult to broaden when prediction of the appropriate prescribed value of the input voltage is problematic.

In addition, the signal output unit preferably includes: an oscillator for oscillating at an amplitude within a prescribed amplification range, and a phase interpolation circuit for adjusting the oscillation frequency of the oscillator based on the second current and the third current.

According to the above-described invention, an oscillator oscillates at amplitude within a prescribed amplification range. The phase interpolation circuit adjusts the oscillation frequency of the oscillator based on the first current, the second current, and the third current.

As a result, setting the prescribed amplification range to a range between the power-supply voltage and ground voltage allows the amplitude of the signal that is supplied to be increased. Accordingly, the phase noise characteristic of a voltage-controlled oscillator can be improved.

The phase interpolation circuit preferably includes an input terminal for receiving current that flows to the phase interpolation circuit and an output terminal for supplying current that flows through the phase interpolation circuit, and adjusts the oscillation frequency of the oscillator in accordance with the current that flows to the phase interpolation circuit; the converter is preferably connected between the power-supply terminal and the input terminal, allows the flow of current that accords with the input voltage, and includes a plurality of constant-current circuits that are connected in parallel between the output terminal and a ground terminal, and further, that allow a constant current to flow when the first switches are ON; and the linear adjustment unit preferably includes a plurality of variable-current circuits that are connected together in parallel between the output terminal and the ground terminal and further, that allow a current that accords with the input voltage to flow when the second switches are ON.

According to the above-described invention, each first and second switch can be made up from an nMOS transistor, whereby the area of the voltage-controlled oscillator can be reduced. These effects can be realized because an nMOS transistor can realize the same transconductance as a pMOS transistor in a smaller area.

In addition, the frequency synthesizer of the present invention is a frequency synthesizer that includes a plurality of PLL circuits for supplying signals of frequencies of different frequency ranges based on the signal of a reference frequency; each PLL circuit including: a voltage-controlled oscillation unit for, according to the input voltage, supplying a signal of a frequency of a frequency range that accords with that PLL circuit, a variable frequency divider for frequency-dividing the signal that is supplied by the voltage-controlled oscillation unit, and an input voltage control unit for generating a phase difference signal that indicates the phase difference between the reference frequency and the frequency of the signal that was frequency-divided by the variable frequency divider and controlling the input voltage based on the phase difference signal; and further, includes a selection unit for supplying any one of the signals supplied from each PLL circuit.

In addition, the oscillation frequency control method of the present invention is a method of controlling oscillation frequency that is carried out by a frequency synthesizer that includes a plurality of PLL circuits for supplying signal of a frequency in different frequency ranges based on a signal of a reference frequency, the oscillation frequency control method including: a voltage-controlled oscillation step in which each PLL circuit supplies a signal of a frequency of a frequency range that accords with the PLL circuit according to the input voltage; a frequency-dividing step in which each PLL circuit frequency-divides the signals that are supplied; a phase difference generation step in which each PLL circuit generates a phase difference signal that indicates the phase difference between the reference frequency and the frequency of the frequency-divided signal; an input voltage control step in which each PLL circuit controls the input voltage based on the phase difference signal that was generated; and a selection step in which the frequency synthesizer supplies any one of the signals supplied by each PLL circuit.

According to the above-described invention, a signal of a frequency of an oscillation frequency range that accords with each PLL circuit is supplied from that PLL circuit. In addition, any one of the signals of these frequencies is supplied.

As a result, when the frequency synthesizer generates a signal of a frequency contained within a prescribed frequency range, the frequency range of the frequency of the signal supplied from each of the PLL circuits may be smaller than the prescribed frequency range. As a result, the variable frequency range can be broadened while suppressing increase of gain.

The present invention preferably further includes: a multiplier circuit for multiplying a signal of the reference frequency; a second selection unit for supplying to each PLL circuit one signal from among the reference frequency and one signal from among the reference frequency signals that has been multiplied; and a power-supply control unit for supplying power to the multiplier circuit when the second selection unit supplies the signal of the reference frequency that has been multiplied and for halting supply of power to the multiplier circuit when the second selection unit supplies a signal of the reference frequency.

According to the above-described invention, the signal of the reference frequency is multiplied. In addition, one signal from among the reference frequency and one signal from among the reference frequency signals that has been multiplied is supplied to each PLL circuit. When the reference signal is supplied to a PLL circuit, the supply of power to the multiplier circuit that multiplies the signal of the reference frequency is halted.

As a result, the power that is used can be reduced in a frequency oscillator that can multiply the reference frequency.

Finally, the voltage-controlled oscillation unit is preferably made up by the voltage-controlled oscillator.

Effect of the Invention

According to the present invention, the variable frequency range can be broadened while suppressing increase of conversion gain.

BRIEF DESCRIPTION OF THE DRAWINGS

FIG. 12 is a circuit diagram showing an example of a delay cell;

FIG. 13 is a block diagram showing the configuration of a voltage-controlled oscillator of another working example of the present invention;

FIG. 14 is a circuit diagram showing an example of a switch-controlled current source;

BEST MODE FOR CARRYING OUT THE INVENTION

Explanation next regards embodiments of the present invention with reference to the accompanying figures.

Figure 1:
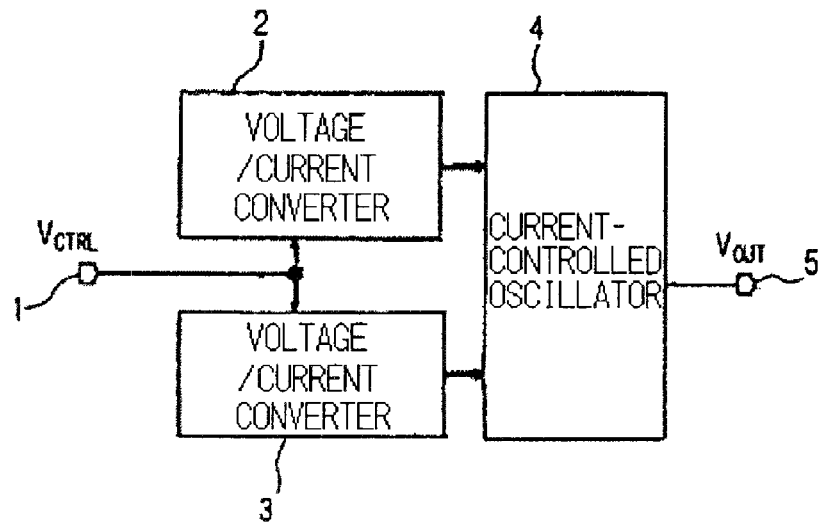
FIG. 1 is a block diagram showing the configuration of a voltage-controlled oscillator of the related art.
Figure 2:
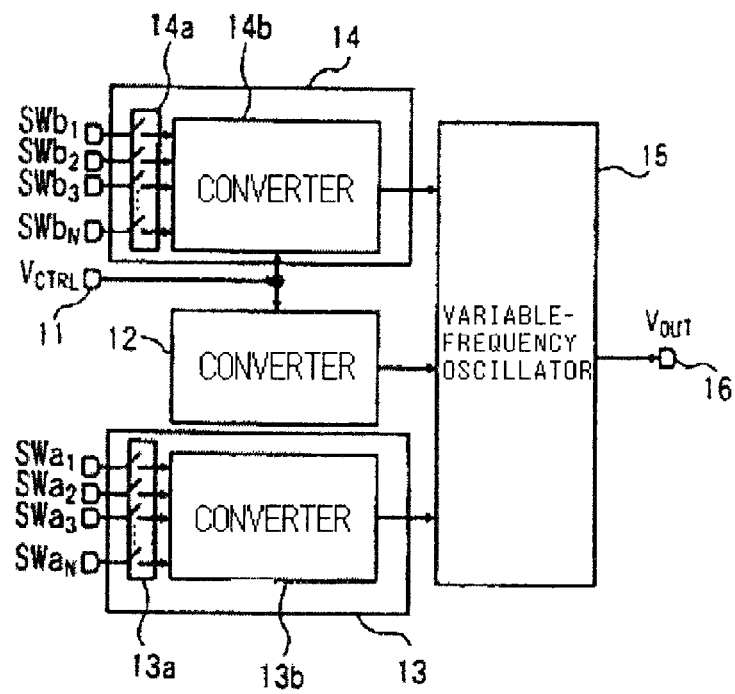
FIG. 2 is a block diagram showing the configuration of a voltage-controlled oscillator of a working example of the present invention.

FIG. 2 is a block diagram showing the configuration of a voltage-controlled oscillator of an embodiment of the present invention.

In FIG. 2, the voltage-controlled oscillator includes: input terminal 11, converter 12, variable converters 13 and 14, variable-frequency oscillator 15, and output terminal 16.

An input voltage is applied to input terminal 11.

Converter 12 converts the input voltage to a first physical quantity that accords with the input voltage.

Variable converter 13 includes switch group 13a and converter 13b. Variable converter 13 is one example of the offset adjustment unit.

Switch group 13a includes a plurality of switches for offsetting frequency in accordance with the input voltage. Each switch is connected to a power-supply terminal (not shown) to which the power-supply voltage is applied. The switches are each connected together in parallel. In addition, the number of switches in switch group 13a is N in the present embodiment, four switches (SWa 1 to SWa 3 and SWa N) among the N switches being shown in FIG. 2.

Variable converter 13 (more specifically, converter 13b) generates the second physical quantity that accords with the status of each of the switches.

Variable converter 14 includes switch group 14a and converter 14b. Variable converter 14 is an example of the linear adjustment unit.

Switch group 14a includes a plurality of switches for implementing linear adjustment of the relation between the input voltage and frequency. The relation between the input voltage and frequency is the input/output characteristic of the voltage-controlled oscillator.

Each of the switches of switch group 14a is connected to a power-supply terminal to which the power-supply voltage is applied. In addition, the switches are each connected together in parallel. The number of switches of switch group 14a is N in the present embodiment, four switches (SWb 1 to SWb 3 and SWb N) among the N switches being shown in FIG. 2. Although the number of switches of switch group 14a is the same as the number of switches of switch group 13a in the present embodiment, the number of switches of switch group 14a may actually be different from the number of switches of switch group 13a.

Variable converter 14 (more specifically, converter 14b) supplies the third physical quantity that accords with the input voltage and the status of each switch of switch group 14a when the input voltage is contained in a prescribed voltage range for implementing linear adjustment of the relation between the input voltage and the frequency.

In addition, variable converter 14 may include, in place of switch group 14a, a generation circuit for generating a status value for implementing the linear adjustment of the relation between the input voltage and frequency. The generation circuit is connected to the power-supply terminal, adjusts the value of the power-supply voltage, and uses the adjusted value as the status value.

In this case, variable converter 14 generates the third physical quantity that accords with the input voltage and the status value when the input voltage is contained in the prescribed voltage range.

Variable-frequency oscillator 15 supplies a signal of a frequency that accords with the first physical quantity, the second physical quantity, and the third physical quantity. In addition, variable-frequency oscillator 15 is an example of the signal output unit.

The types of physical quantity are, for example, current, resistance, or electrical capacitance. In addition, the types of physical quantity are not limited to current, resistance, or electrical capacitance and can be altered as appropriate.

Explanation next regards the operations.

Converter 12 converts the input voltage that is applied to input terminal 11 to a first physical quantity that accords with the input voltage. Converter 12 supplies the first physical quantity to variable-frequency oscillator 15.

Converter 13b generates a second physical quantity that accords with the status of each of the switches of switch group 13a and supplies this second physical quantity to variable-frequency oscillator 15.

Converter 14b generates a third physical quantity that accords with the input voltage and the status of each of the switches of switch group 14a when the input voltage is contained in the prescribed voltage range and supplies the third physical quantity to variable-frequency oscillator 15.

Variable-frequency oscillator 15 receives the first physical quantity, the second physical quantity, and the third physical quantity and supplies a signal of a frequency that accords with the first physical quantity, the second physical quantity, and the third physical quantity to output terminal 16. For example, variable-frequency oscillator 15 supplies to output terminal 16 a signal of frequency that is increased to the extent of the increase of the sum of the first physical quantity, the second physical quantity, and the third physical quantity.

Explanation next regards the effects.

According to the present embodiment, converter 12 converts the input voltage to a first physical quantity that accords with the input voltage. Variable converter 13 supplies a second physical quantity that accords with the status of each of the switches of switch group 13a. Variable converter 14 supplies a third physical quantity that accords with the input voltage and the status of each of the switches of switch group 14a when the input voltage is contained in the prescribed voltage range. Variable-frequency oscillator 15 supplies a signal of a frequency that accords with the first physical quantity, the second physical quantity, and the third physical quantity.

Variable converter 14 may include a generation circuit in place of switch group 14a, and may supply a signal of a frequency that accords with the input voltage and the status value generated in this generation circuit.

In this case, the relation between the input voltage and frequency can be altered by altering the status of each of the switches of switch group 13a, thereby enabling multiple settings of the input/output characteristics of the voltage-controlled oscillator. In addition, the range within which each input/output characteristic is linear can be broadened because the relation between the input voltage and frequency is subjected to linear adjustment by the third physical quantity. Accordingly, the variable frequency range can be broadened while suppressing conversion gain.

Explanation next regards the voltage-controlled oscillator that adjusts each switch of variable converter 14.

Figure 3:
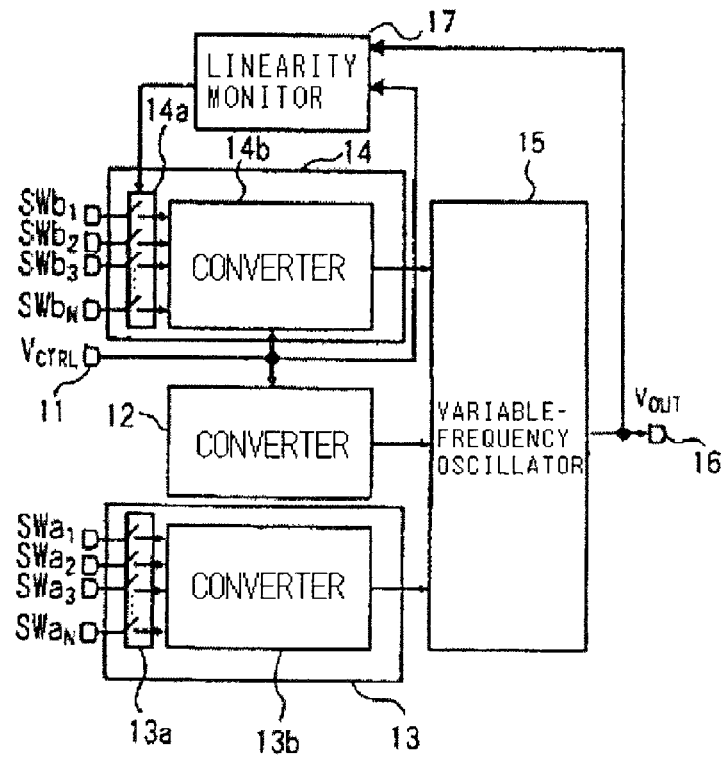
FIG. 3 is a block diagram showing the configuration of a voltage-controlled oscillator of another working example of the present invention.

FIG. 3 is a block diagram showing an example of the configuration of the voltage-controlled oscillator for adjusting each switch of variable converter 14. The following explanation chiefly regards the configuration and operation that differ from FIG. 2. Components in FIG. 3 that are identical to components in FIG. 2 are given the same reference numbers.

In FIG. 3, the voltage-controlled oscillator further includes linearity monitor 17 in addition to the configuration shown in FIG. 2.

Linearity monitor 17 controls each of the switches of switch group 14a such that the input/output characteristics of the voltage-controlled oscillator become linear based on the input voltage that is applied to input terminal 11 and the signal that is supplied by variable-frequency oscillator 15.

For example, linearity monitor 17 includes a frequency counter circuit for counting the frequency of the signal, and based on the results of counting of the frequency counter circuit and the input voltage, controls switch group 14a such that the input/output characteristic of the voltage-controlled oscillation circuit becomes linear.

Linearity monitor 17 is one example of a switch control circuit.

Explanation next regards operation.

Variable-frequency oscillator 15 further supplies to linearity monitor 17 a signal of a frequency that accords with the first physical quantity, the second physical quantity, and the third physical quantity.

The frequency counter circuit of linearity monitor 17 receives the signal from variable-frequency oscillator 15 and measures the frequency of this signal.

Based on the count results and the input voltage that is applied to input terminal 11, linearity monitor 17 controls each of the switches of switch group 14a such that the input/output characteristics of the voltage-controlled oscillation circuit become linear.

More specifically, based on the count results of the frequency counter circuit and the input voltage, linearity monitor 17 first finds the shift width from the linearity of the input/output characteristics of the voltage-controlled oscillation circuit. The shift width from linearity of the input/output characteristics is hereinbelow referred to as nonlinearity. Linearity monitor 17 then computes the third physical quantity such that this nonlinearity is corrected and supplies a switch control signal to each of the switches of switch group 14a such that this third physical quantity is generated.

Each of the switches of switch group 14a then, upon receiving the switch control signal, turns ON or OFF in accordance with the switch control signal.

Explanation next regards the effects.

A frequency that accords with the input voltage changes due to, for example, temperature, ambient fluctuations of the power-supply voltage, and secular change of various devices. As a result, it is in some cases difficult for the designer of a voltage-controlled oscillator to know in advance the third physical quantity that can realize linearity for each of the input/output characteristics.

In the present embodiment, linearity monitor 17 controls each of the switches of switch group 14a based on the input voltage and a signal that is supplied by variable-frequency oscillator 15.

In this case, if each of the switches of switch group 14a is controlled such that a third physical quantity is supplied that realizes linearity of the input/output characteristics of the voltage-controlled oscillator, the range in which each input/output characteristic becomes linear can be broadened even when it is difficult to predict a third physical quantity such that each input/output characteristic is linear.

Explanation next regards another example of a voltage-controlled oscillator for adjusting each switch of the variable converter.

Figure 4:
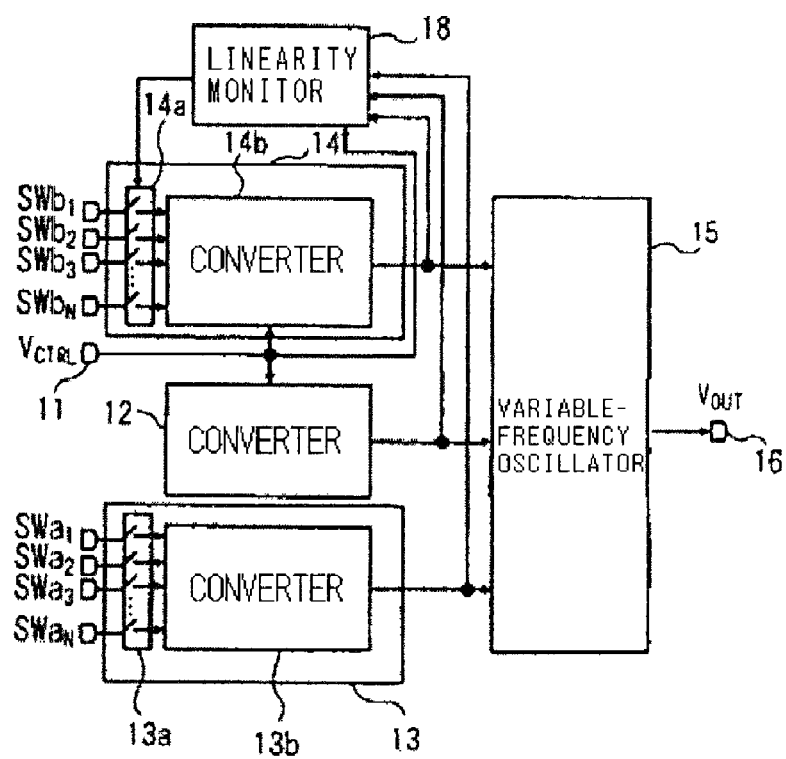
FIG. 4 is a block diagram showing the configuration of a voltage-controlled oscillator of another working example of the present invention.

FIG. 4 is a block diagram showing an example of the configuration of a voltage-controlled oscillator for adjusting each of the switches of variable converter 14. Explanation here chiefly regards the configuration and operations that differ from FIG. 2 or FIG. 3. In FIG. 4, components that are identical to FIG. 2 are given the same reference numbers.

In FIG. 4, the voltage-controlled oscillator includes linearity monitor 18 in addition to the configuration shown in FIG. 2.

Linearity monitor 18 controls each of the switches of switch group 14a based on the input voltage, the first physical quantity, the second physical quantity, and the third physical quantity such that the input/output characteristics of the voltage-controlled oscillation circuit become linear. In addition, linearity monitor 18 is one example of a switch control circuit.

Because the frequency of the signal need not be counted, linearity monitor 18 differs from linearity monitor 17 shown in FIG. 3 and does not need the provision of a frequency counter circuit.

Explanation next regards the operation.

Converter 12 supplies the first physical quantity to linearity monitor 18. Converter 13b supplies the second physical quantity to linearity monitor 18. Converter 14b further supplies the third physical quantity to linearity monitor 18.

Linearity monitor 18 receives the first physical quantity from converter 12, receives the second physical quantity from converter 13b, and receives the third physical quantity from converter 14b.

Based on the input voltage that is applied to input terminal 11, the first physical quantity, the second physical quantity, and the third physical quantity, linearity monitor 18 controls each of the switches of switch group 14a such that the input/output characteristics of the voltage-controlled oscillation circuit become linear.

For example, when variable-frequency oscillator 15 supplies a signal of a frequency that accords with the sum of the first physical quantity, the second physical quantity, and the third physical quantity, linearity monitor 18 holds, for each input voltage, the reference value of the first physical quantity that accords with the input voltage, and further, holds, for the status of each of the switches, the reference value of the second physical quantity that accords with the status of each switch of switch group 13a.

In this case, linearity monitor 18 finds the sum of the reference value of the second physical quantity that is closest to the value of the second physical quantity that was received and the reference value of the first physical quantity that accords with the input voltage applied to input terminal 11. Linearity monitor 18 further finds the sum of the first and second physical quantities that were received.

Linearity monitor 18 next computes the difference between the sum of the reference values of the first and second physical quantities and the sum of the first and second physical quantities that were received and supplies a switch control signal to each switch of switch group 14a such that the value of the third physical quantity is changed by this difference.

Explanation next regards the effects of the present embodiment.

In the present embodiment, linearity monitor 18 controls the switches of switch group 14a based on the input voltage, the first physical quantity, the second physical quantity, and the third physical quantity.

In this case, if each of the switches of switch group 14a is controlled to supply a third physical quantity such that the input/output characteristics of the voltage-controlled oscillator become linear, the range over which each input/output characteristic becomes linear can be broadened even when it is difficult to predict the third physical quantity such that each of the input/output characteristics becomes linear.

Explanation next regards a voltage-controlled oscillator in which current is used as the physical quantity.

Figure 5:
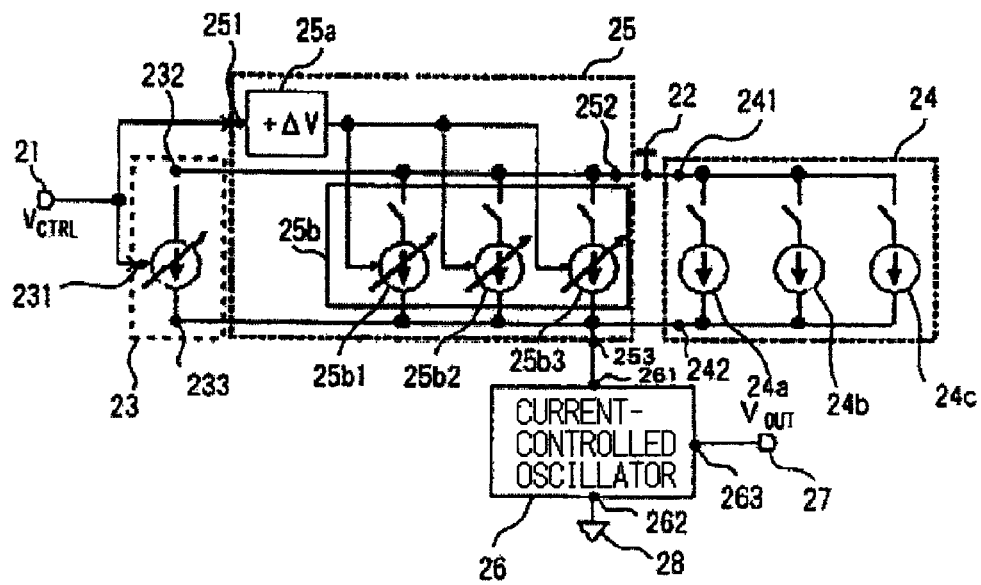
FIG. 5 is a block diagram showing the configuration of a voltage-controlled oscillator of another working example.

FIG. 5 is a block diagram showing an example of the configuration of a voltage-controlled oscillator in which current is used as the physical quantity. In this case, the first physical quantity is a first current, the second physical quantity is a second current, and the third physical quantity is a third current.

In FIG. 5, the voltage-controlled oscillator includes input terminal 21, power-supply terminal 22, converter 23, variable converters 24 and 25, current-controlled oscillator 26, output terminal 27, and GND terminal 28.

An input voltage is applied to input terminal 21.

A power-supply voltage is applied to power-supply terminal 22.

Converter 23 is one example of converter 12 when the first physical quantity is the first current.

Converter 23 is connected between power-supply terminal 22 and current-controlled oscillator 26. More specifically, terminal 231 of converter 23 is connected to input terminal 21, terminal 232 of converter 23 is connected to power-supply terminal 22, and terminal 233 of converter 23 is connected to input terminal 261 of current-controlled oscillator 26.

Converter 23 converts the input voltage that is applied to input terminal 21 to a first current that accords with the input voltage and supplies this first current to current-controlled oscillator 26.

Variable converter 24 is one example of variable converter 13 when the second physical quantity is a second current.

Variable converter 24 is connected between power-supply terminal 22 and current-controlled oscillator 26. More specifically, terminal 241 of variable converter 24 is connected to power-supply terminal 22, and terminal 242 of variable converter 24 is connected to input terminal 261 of current-controlled oscillator 26.

Variable converter 24 includes switch control current sources 24a to 24c. The number of switch control current sources is just three in FIG. 5, but the number is not actually limited to three and can be altered as appropriate. In addition, each of switch control current sources 24a to 24c is one example of a constant-current circuit.

Each of switch control current sources 24a to 24c includes a switch and is connected in parallel between power-supply terminal 22 and current-controlled oscillator 26.

Each of switch control current sources 24a to 24c allows a constant current to flow when its own switch is ON. The sum of the constant currents is the second current.

Variable converter 25 is one example of variable converter 14 when the third physical quantity is the third current.

Variable converter 25 is connected between power-supply terminal 22 and voltage-controlled oscillator 26. More specifically, terminal 251 of variable converter 25 is connected to input terminal 21, terminal 252 of variable converter 25 is connected to power-supply terminal 22, and terminal 253 of variable converter 25 is connected to input terminal 261 of current-controlled oscillator 26.

Variable converter 25 includes level-shifting circuit 25a and switch control converter 25b.

The input terminal of level-shifting circuit 25a is connected to input terminal 21, and the output terminal of level-shifting circuit 25a is connected to the control terminal of switch control converter 25b.

Level-shifting circuit 25a lowers the input voltage that is applied to input terminal 21 by a prescribed value to generate a level-shifted voltage.

The control terminal of switch control converter 25b is connected to the output terminal of level-shifting circuit 25a. In addition, the input terminal of switch control converter 25b is connected to power-supply terminal 22 by way of terminal 252. The output terminal of switch control converter 25b is further connected to input terminal 261 of current-controlled oscillator 26 by way of terminal 253.

Switch control converter 25b further includes a plurality of switches and generates a third current in accordance with the level-shifted voltage and the status of each switch included by switch control converter 25b when the level-shifted voltage of switch control converter 25b is contained within the specific voltage range obtained by lowering the prescribed voltage range by a prescribed value. Switch control converter 25*b* is an example of the output circuit.

Explanation next regards the actual configuration of switch control converter 25*b*.

Switch control converter 25*b* includes switch control voltage/current converters 25*b*1 to 25*b*3.

Switch control voltage/current converters 25*b*1 to 25*b*3 are each connected in parallel between power-supply terminal 22 and current-controlled oscillator 26. In addition, the control terminals of each of switch control voltage/current converters 25*b*1 to 25*b*3 are connected to the output terminal of level-shifting circuit 25*a*. Each of switch control voltage/current converters 25*b*1 to 25*b*3 is an example of the variable-current circuit.

Each of switch control voltage/current converters 25*b*1 to 25*b*3 includes a switch and allows a specific current that accords with the input voltage (specifically, the level-shifted voltage) to flow when its own switch is ON. The sum of the specific currents becomes the third current.

Input terminal 261 of current-controlled oscillator 26 is connected to terminal 233 of converter 23, terminal 242 of variable converter 24, and terminal 253 of variable converter 25. In addition, current output terminal 262 of current-controlled oscillator 26 is connected to GND terminal 28, and signal output terminal 263 of current-controlled oscillator 26 is connected to output terminal 27.

Current-controlled oscillator 26 receives the sum of the first current, the second current, and the third current (hereinbelow also referred to as the "control current") and supplies a signal of a frequency that accords with the control current.

Explanation next regards the frequency offset realized by variable converter 24.

Figure 6:
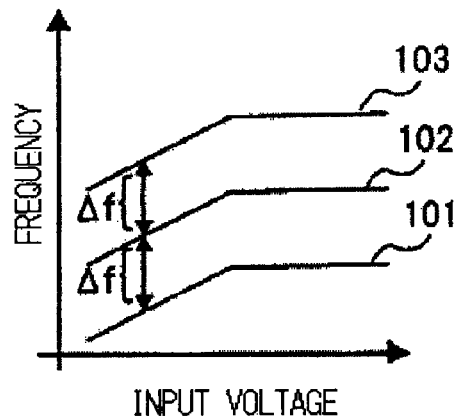
FIG. 6 is a graph for explaining an example of frequency offset.

FIG. 6 is a graph for explaining an example of the frequency offset realized by variable converter 24. In FIG. 6, the horizontal axis shows the input voltage and the vertical axis shows frequency.

In FIG. 6, each of graphs 101 to 103 shows input/output characteristics of a voltage-controlled oscillator for which the status of switches of switch control current sources 24*a* to 24*c* differ.

More specifically, graph 101 shows the input/output characteristic when the switches of switch control current sources 24*a* to 24*c* are all OFF. Graph 102 shows the input/output characteristic when any one of the switches of switch control current sources 24*a* to 24*c* is ON. Graph 103 shows the input/output characteristic when any two of the switches of switch control current sources 24*a* to 24*c* are ON.

The input/output characteristic of the voltage-controlled oscillator when there are no switch control current sources 24*a* to 24*c* is only the input/output characteristic shown by graph 101. The provision of switch control current sources 24*a* to 24*c* results in a plurality of input/output characteristics of the voltage-controlled oscillator and broadens the variable frequency range of the voltage-controlled oscillator.

In FIG. 6, offset width Δf indicates the offset quantity resulting from switch control current sources 24*a* to 24*c*.

Explanation next regards the correction of the nonlinearity resulting from variable converter 25.

Figure 7A:
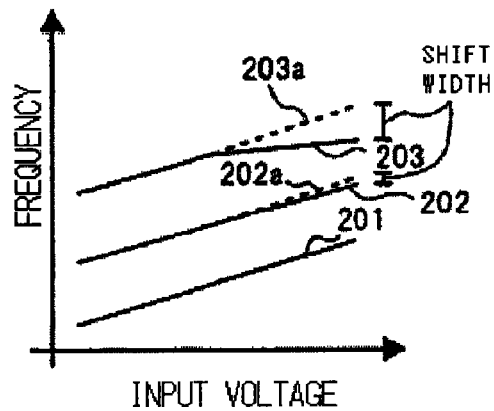
FIG. 7A is a graph for explaining an example of correction of nonlinearity.
Figure 7B:
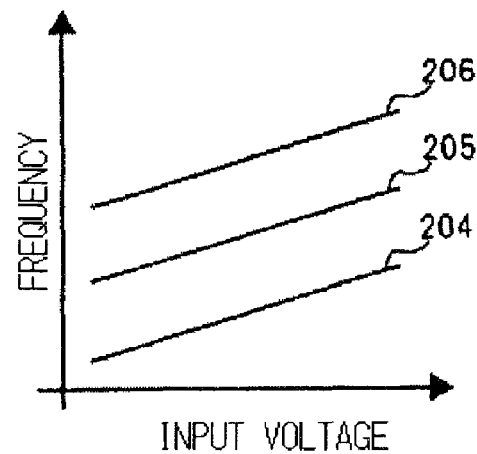
FIG. 7B is a graph for explaining an example of correction of nonlinearity.

FIGS. 7A and 7B are graphs for explaining an example of the correction of the nonlinearity resulting from variable converter 25. In FIGS. 7A and 7B, the horizontal axis shows the input voltage and the vertical axis shows frequency.

FIG. 7A is a graph for explaining correction of the nonlinearity when the number of switch control voltage/current converters is just one.

In FIG. 7A, each of graphs 201 to 203 shows input/output characteristics of a voltage-controlled oscillator for which the status of the switches of switch control current sources 24*a* to 24*c* differs.

When the number of switch control voltage/current converters is just one, nonlinearity can be corrected for only one input/output characteristic. Graph 201 shows an input/output characteristic for which nonlinearity has been corrected, and graphs 202 and 203 show input/output characteristics for which nonlinearity is not corrected.

Graphs 202*a* and 203*a* show the input/output characteristics when the nonlinearity of the input/output characteristics shown in graphs 202 and 203 has been corrected. The difference between graph 202 and graph 202*a* and the difference between graph 203 and graph 203*a* show the shift width from linearity (nonlinearity) of each input/output characteristic.

FIG. 7B is a graph for explaining the correction of nonlinearity when there is a plurality of switch control voltage/current converters.

In FIG. 7B, each of graphs 204 to 206 shows the input/output characteristic of a voltage-controlled oscillator in which the status of the switches of switch control current sources 24*a* to 24*c* differs.

When the number of switch control voltage/current converters is a plurality, the third current supplied by variable converter 25 changes in accordance with the status of the switches of each of switch control voltage/current converters 25*b*1 to 25*b*3. As a result, nonlinearity of a plurality of input/output characteristics can be corrected. All of the input/output characteristics shown in graphs 204 to 206 represent input/output characteristics in which nonlinearity has been corrected.

Figure 8:
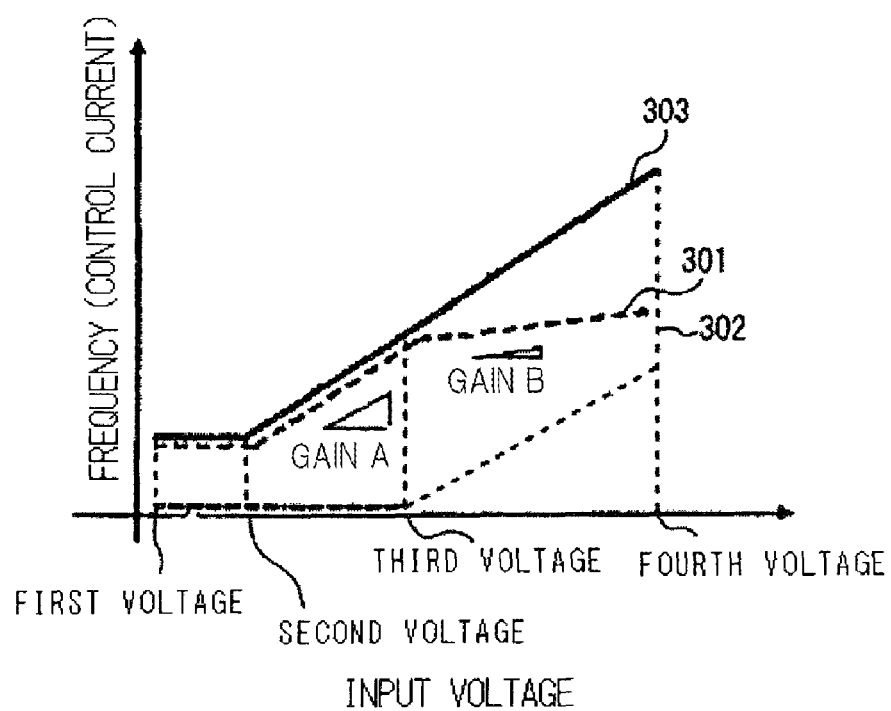
FIG. 8 is a graph for explaining an example of correction of nonlinearity.

FIG. 8 is a graph for further explanation of the correction of nonlinearity. In FIG. 8, the horizontal axis shows the input voltage, and the vertical axis shows frequency. In FIG. 8, the relation between the control current and frequency is assumed to be linear. In this case, frequency of the vertical axis may also be read as the control current.

The voltage/current conversion by means of converter 23 is assumed to be carried out by MOS transistors. The voltage/current conversion carried out by MOS transistors would be obvious to a person skilled in the art and explanation is therefore here omitted.

In this case, converter 23 has a conversion characteristic such as shown in graph 301 of FIG. 8. In graph 301, the conversion gain of converter 23 is "0" when the input voltage is between a first voltage and a second voltage, is the first conversion gain (hereinbelow referred to as "gain A") when the input voltage is between the second voltage and a third voltage, and is a second conversion gain (hereinbelow referred to as "gain B") when the input voltage is between the third voltage and a fourth voltage.

In oscillation resulting from the first current that is converted in converter 23, the input/output characteristic of the voltage-controlled oscillator becomes linear when the input voltage is between the second voltage and the third voltage, but does not become linear when the input voltage is between the second voltage and the fourth voltage.

As a result, variable converter 25 does not implement conversion when the input voltage is between the second voltage and the third voltage but must have a conversion gain of the difference between gain A and gain B when the input voltage is between the third voltage and the fourth voltage.

Graph 302 is a graph for explaining the conversion characteristic of variable converter 25 in this case. In graph 302, the conversion gain of variable converter 25 is "0" when the input voltage is between the first voltage and the third voltage, and is the conversion gain of the difference between gain A and gain B when the input voltage is between the third voltage and the fourth voltage.

When a MOS transistor is used as variable converter 25, the third voltage must be the same as the threshold value of the MOS transistor that carries out this conversion in order for the conversion gain of variable converter 25 to change at the third voltage, but providing such a transistor is problematic in some cases.

As a result, level-shifting circuit 25a sets the difference between the second voltage and third voltage as the prescribed value. In this case, a MOS transistor in which the threshold value is the second voltage and that is used as converter 23 can be used as variable converter 25. At this time, switch control converter 25b converts the level-shifted voltage to the third physical quantity at a conversion gain of a value that is the difference between gain A and gain B.

Graph 303 shows the conversion characteristic of a composite circuit that combines converter 23 and variable converter 25. In graph 303, the conversion gain of the composite circuit is "0" when the input voltage is between the first voltage and the second voltage and is gain A when the input voltage is between the second voltage and the fourth voltage.

Accordingly, by providing variable converter 25, the range within which the input/output characteristics of a voltage-controlled oscillator becomes linear is broadened from the range between the second voltage and the third voltage to the range between the second voltage and the fourth voltage.

In this case, the range from the third voltage to the fourth voltage becomes the prescribed voltage range, and the specific voltage range is the range obtained by lowering this prescribed voltage range by the difference between the second voltage and the third voltage.

Although a case was described in FIG. 8 in which frequency is not offset by variable converter 24, the range within which the input/output characteristics of a voltage-controlled oscillator become linear can be broadened even when frequency is offset by variable converter 24.

For example, even when the conversion gain of a voltage-controlled oscillator differs for each offset of the offset frequency by variable converter 24, the range within which the input/output characteristics of a voltage-controlled oscillator are made linear can be broadened for each frequency that has been offset by setting the status of the switches of variable converter 25 for each such offset.

Explanation next regards effects of the present embodiment.

In the present embodiment, level-shifting circuit 25a lowers the input voltage by a prescribed value to generate a level-shifted voltage. Switch control converter 25b includes a plurality of switches and supplies a third physical quantity that accords with the level-shifted voltage and the status of each of the switches when this level-shifted voltage is contained in a specific voltage range obtained by lowering the prescribed voltage range by a prescribed value.

When MOS transistors are used as variable converter 25 and converter 23, setting the difference between the value of the voltage at which the conversion gain of converter 23 changes and the threshold value of the MOS transistors that are used in variable converter 25 as the prescribed value can facilitate the generation of the third physical quantity when the input voltage is contained in the prescribed voltage range.

Explanation next regards a voltage-controlled oscillator in which the shift quantity of the input voltage is variable.

Figure 9:
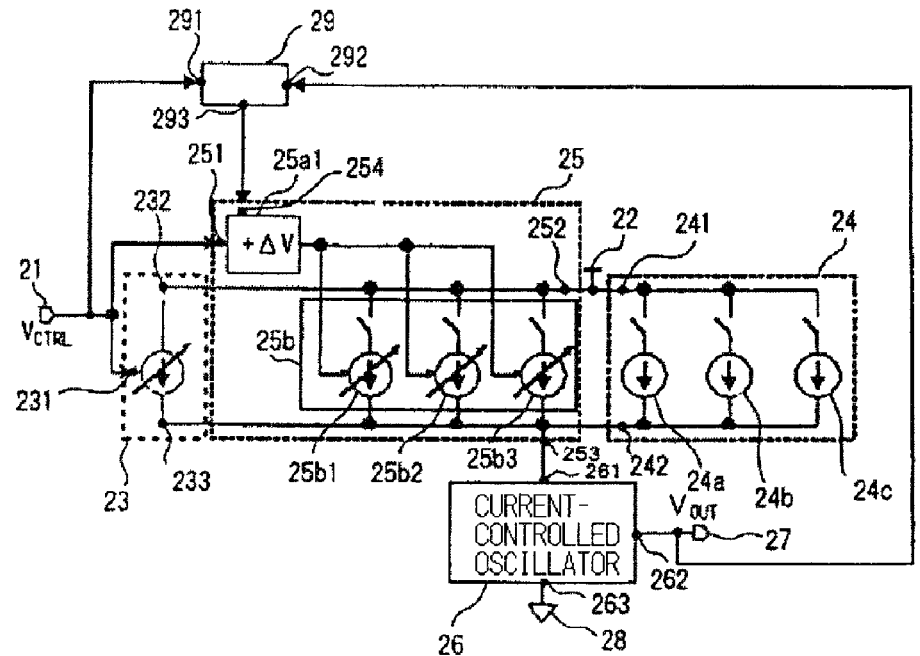
FIG. 9 is a block diagram showing the configuration of a voltage-controlled oscillator of another working example of the present invention.

FIG. 9 is a block diagram showing an example of the configuration of a voltage-controlled oscillator in which the shift quantity of the input voltage is variable. The following explanation chiefly regards the configuration and operations that differ from the voltage-controlled oscillator shown in FIG. 5. In FIG. 9, components identical to FIG. 5 are given the same reference numbers.

In FIG. 9, the voltage-controlled oscillator further includes shift control circuit 29 in addition to the configuration shown in FIG. 5. In addition, variable converter 25 includes variable level-shifting circuit 25a1 in place of level-shifting circuit 25a.

Variable level-shifting circuit 25a1 is a level-shifting circuit in which the prescribed value is variable. Variable level-shifting circuit 25a1 includes a control terminal for receiving a shift control signal that indicates a prescribed value.

The input terminal of variable level-shifting circuit 25a1 is connected to input terminal 21, the output terminal of variable level-shifting circuit 25a1 is connected to the control terminal of switch control converter 26b, and the control terminal of variable level-shifting circuit 25a1 is connected to terminal 293 of shift control circuit 29.

Terminal 291 of shift control circuit 29 is connected to input terminal 21. Terminal 292 of shift control circuit 29 is connected to output terminal 262 of current-controlled oscillator 26. In addition, terminal 293 of shift control circuit 29 is connected to the control terminal of variable level-shifting circuit 25a1 by way of terminal 254 of variable converter 25.

Shift control circuit 29 receives a signal from current-controlled oscillator 26. Shift control circuit 29 controls the prescribed value based on the input voltage that is applied to input terminal 21 and this signal.

For example, shift control circuit 29 includes a frequency counter circuit, and the frequency counter circuit counts the frequency of the signal. Shift control circuit 29 finds the shift width from linearity of the input/output characteristic of the voltage-controlled oscillation circuit based on the count result and the input voltage. Shift control circuit 29 computes the prescribed value such that this shift width is corrected and supplies a shift control signal that indicates this prescribed value to variable level-shifting circuit 25a1.

After receiving this shift control signal, variable level-shifting circuit 25a1 then lowers the input voltage by the prescribed value indicated by this shift control signal to generate a shift voltage.

Explanation next regards the effects of the present embodiment.

The range of the input voltage in which the input/output characteristic of the voltage-controlled oscillator does not become linear changes due to temperature, ambient fluctuation of the power-supply voltage, and secular change of various devices, and as a result, the appropriate prescribed value is in some cases difficult to predict.

In the present embodiment, shift control circuit 29 controls this prescribed value based on the input voltage and a signal that is supplied by current-controlled oscillator 26.

In this case, the range within which the input/output characteristics of a voltage-controlled oscillator become linear can be broadened even when the appropriate prescribed value is difficult to predict.

Explanation next regards an example of the configuration of current-controlled oscillator 26.

Figure 10:
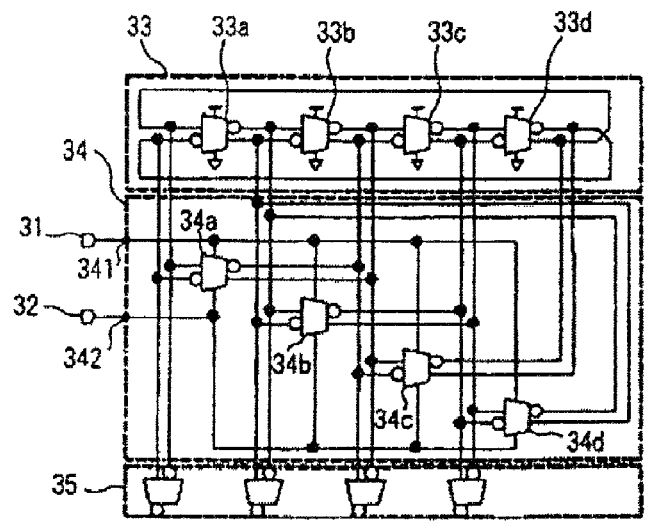
FIG. 10 is a circuit diagram showing an example of a current-controlled oscillator.

FIG. 10 is a circuit diagram showing an example of the configuration of current-controlled oscillator 26.

In FIG. 10, current-controlled oscillator 26 includes: input terminal 31, current output terminal 32, oscillator 33, current control phase interpolation circuit 34, and output buffer 35.

Input terminal 31 receives current that flows to current control phase interpolation circuit (hereinbelow referred to as "phase interpolation circuit") 34. Input terminal 31 further corresponds to input terminal 261 of the current-controlled oscillator of FIG. 5.

Current output terminal 32 supplies the current that flows to phase interpolation circuit 34. Current output terminal 32 further corresponds to terminal 262 of the current-controlled oscillator of FIG. 5.

Oscillator 33 oscillates at amplitude within a prescribed amplification range.

For example, oscillator 33 includes delay cells 33a to 33d. Each of delay cells 33a to 33d is connected in a ring form. Each of delay cells 33a to 33d delays and supplies as output the signal that was received.

In addition, the power-supply voltage is applied to the high-potential power input terminal of each of delay cells 33a to 33d, and the ground voltage is applied to the low-potential power input terminals. In this case, the range between the power-supply voltage and the ground voltage is the prescribed amplification range.

In FIG. 10, the number of delay cells of oscillator 33 is just four, but this number is not limited to four and can be altered as appropriate.

Current input terminal 341 of current control phase interpolation circuit (hereinbelow referred to as "phase interpolation circuit") 34 receives current that flows to phase interpolation circuit 34. Current output terminal 342 of phase interpolation circuit 34 supplies the current that flows in phase interpolation circuit 34.

Phase interpolation circuit 34 adjusts the oscillation frequency of oscillator 33 based on the first current, the second current, and the third current.

For example, phase interpolation circuit 34 includes delay cells 34a to 34d. Each of delay cells 34a to 34d is connected to a respective interval between the plurality of nodes of oscillator 33.

The high-potential power input terminals of each of delay cells 34a to 34d receive the current that flows in phase interpolation circuit 34. The low-potential power terminals of each of delay cells 34a to 34d supply the current that flows in phase interpolation circuit 34. Each of delay cells 34a to 34d supplies a signal that is delayed according to current flowing in that delay cell to a respective delay cell of delay cells 33a to 33d of oscillator 33.

In oscillator 33, the amplitude of the signal that is supplied changes according to the change of the voltage that is applied to its high-potential power-supply input terminal and low-potential power-supply input terminal. When the amplitude changes, the oscillation frequency of oscillator 33 also changes, whereby the phase noise characteristic of the voltage-controlled oscillator deteriorates. In the present embodiment, the power-supply voltage is applied to the high-potential power-supply input terminal of oscillator 33 and the ground voltage is applied to the low-potential power-supply input terminal, whereby change in the amplitude of the signal that is supplied by oscillator 33 can be reduced.

Figure 11:
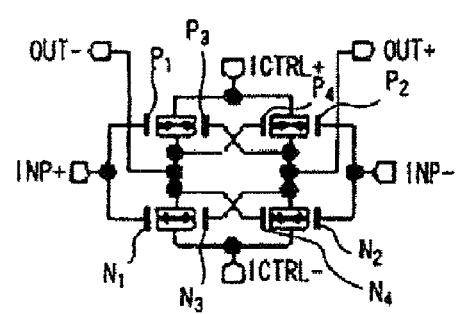
FIG. 11 is a circuit diagram showing an example of a delay cell.

FIGS. 11 and 12 are circuit diagrams showing examples of delay cells of oscillator 33 and phase interpolation circuit 34.

In FIG. 11, the delay cell includes: high-potential power input terminal ICTRL+, low-potential power input terminal ICTRL−, input terminals INP+ and INP−, output terminals OUT+ and OUT−, nMOS transistors N1 to N4, and pMOS transistors P1 to P4.

Inverters are formed by pMOS transistor P1 and nMOS transistor N1, and by pMOS transistor P2 and nMOS transistor N2.

In addition, pMOS transistor P3 and nMOS transistor N3 are the load of the inverter that is formed by pMOS transistor P1 and nMOS transistor N1, and pMOS transistor P4 and nMOS transistor N4 are the load of the inverter that is formed by pMOS transistor P2 and nMOS transistor N2.

The signal that is applied as input to input terminal INP+ is delayed by these inverters and this delayed signal is supplied from output terminal OUT+. The signal applied as input to input terminal INP− is delayed by these inverters and the delayed signal is supplied from output terminal OUT−.

In FIG. 12, the delay cell includes: high-potential power input terminal ICTRL+, low-potential power input terminal ICTRL−, input terminals INP+ and INP−, output terminals OUT+ and OUT−, nMOS transistors N5 to N8, and pMOS transistors P5 and P6.

Inverters are formed by pMOS transistor P5 and nMOS transistor N5, and by pMOS transistor P6 and nMOS transistor N6. NMOS transistor N7 is the load of the inverter formed by pMOS transistor P5 and nMOS transistor N5, and nMOS transistor N8 is the load of the inverter formed by pMOS transistor P6 and nMOS transistor N6.

The delay cells of oscillator 33 and phase interpolation circuit 34 are not limited to the delay cells shown in FIG. 11 and FIG. 12 and can be altered as appropriate.

For example, a delay cell may further include load (for example, a transistor) between high-potential power input terminal ICTRL+ and each inverter for controlling the current that flows to each inverter. In this case, controlling the resistance of this new load by voltage or current enables alteration of the delay time resulting from each delay cell and enables alteration of the frequency of the oscillation signal supplied by oscillator 33.

Returning to FIG. 10, output buffer 35 amplifies the oscillation signal that is supplied from oscillator 33 and supplies the amplified oscillation signal. When, for example, a CMOS logic circuit is on the output destination of output buffer 35 or the oscillation signal need not have amplitude outside the prescribed voltage range, output buffer 35 may be omitted.

Explanation next regards the effect of the present embodiment.

In the present embodiment, oscillator 33 oscillates at amplitude within a prescribed amplitude range. Phase interpolation circuit 34 adjusts the oscillation frequency of the oscillator based on the first current, the second current, and the third current.

In this case, setting the prescribed amplitude range to a range between the power-supply voltage and the ground voltage enables increasing of the amplitude of the signal that is supplied as output. Accordingly, the phase noise characteristic of the voltage-controlled oscillator can be improved.

Explanation next regards another example of the configuration of a voltage-controlled oscillator.

FIG. 13 is a block diagram showing an example of the configuration of a voltage-controlled oscillator. The following explanation chiefly regards the configuration and operations that differ from FIG. 5 and FIG. 10. In FIG. 13, components identical to FIG. 5 or FIG. 10 are given the same reference numbers.

Converter 23 is connected between current output terminal 342 of phase interpolation circuit 34 and GND terminal 28. More specifically, terminal 232 of converter 23 is connected to current output terminal 262 of current-controlled oscillator 26. Terminal 233 of converter 23 is connected to GND terminal 28. Converter 23 causes flow of a current that accords with the input voltage.

Each of switch control current sources 24a to 24c is connected together in parallel between current input terminal 341 of phase interpolation circuit 34 and power-supply terminal 22, and causes flow of a constant current when its own switch is ON.

Each of switch control voltage/current converters 25b1 to 25b3 is connected together in parallel between current input terminal 341 of phase interpolation circuit 34 and power-supply terminal 22, and causes flow of a current that accords with the input voltage when its own switch is ON.

Explanation next regards an example of variable converter 24.

FIG. 14 is a circuit diagram that shows an example of variable converter 24. In FIG. 14, each of switch control current sources 24a to 24c is formed by pMOS transistors. In addition, these pMOS transistors are used as switches by applying the power-supply voltage or the ground voltage to the gates. In addition, when the ground voltage is applied to the gates, the pMOS transistors allow flow of a constant current that accords with the resistance value at that time.

In this case, the second current can be caused to flow while suppressing the increase of the number of levels of vertical stacking of a MOS transistor.

Explanation next regards an example of variable converter 25.

Figure 15:
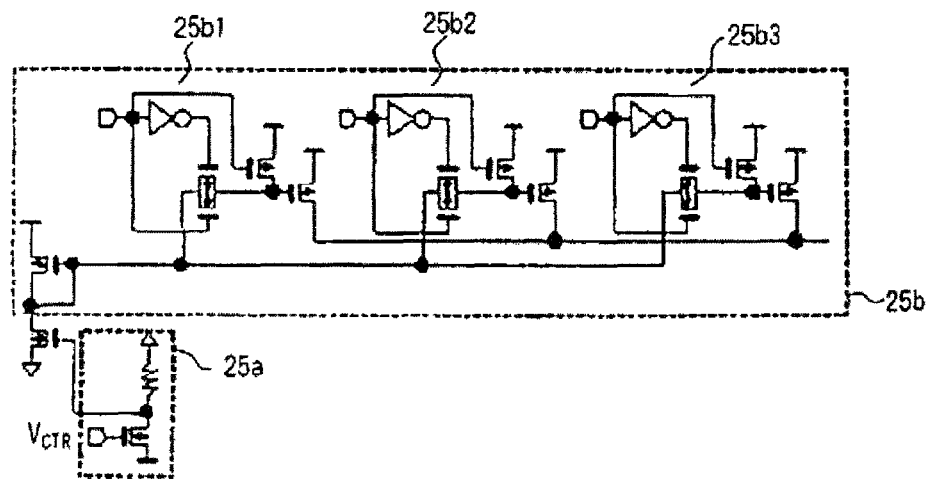
FIG. 15 is a circuit diagram showing an example of a switch-controlled converter.

FIG. 15 is a circuit diagram showing an example of variable converter 25.

In FIG. 15, level-shifting circuit 25a is made up by a source-follower circuit. In a source-follower circuit, a MOS transistor and resistor are connected in a series, in this case, the input voltage is level-shifted according to the value of the resistor.

Each of switch control voltage/current converters 25b1 to 25b3 includes a current-mirror circuit, a pass transistor, and a MOS transistor. In addition, when the power-supply voltage or ground voltage is applied to the gate of this MOS transistor, the status changes in accordance with the voltage that is applied. The current-mirror circuit operates when the MOS transistor is ON, and the operation of the current-mirror circuit halts when the MOS transistor is OFF. The MOS transistor is thus used as a switch.

Explanation next regards another example of the configuration of the voltage-controlled oscillator.

Figure 16:
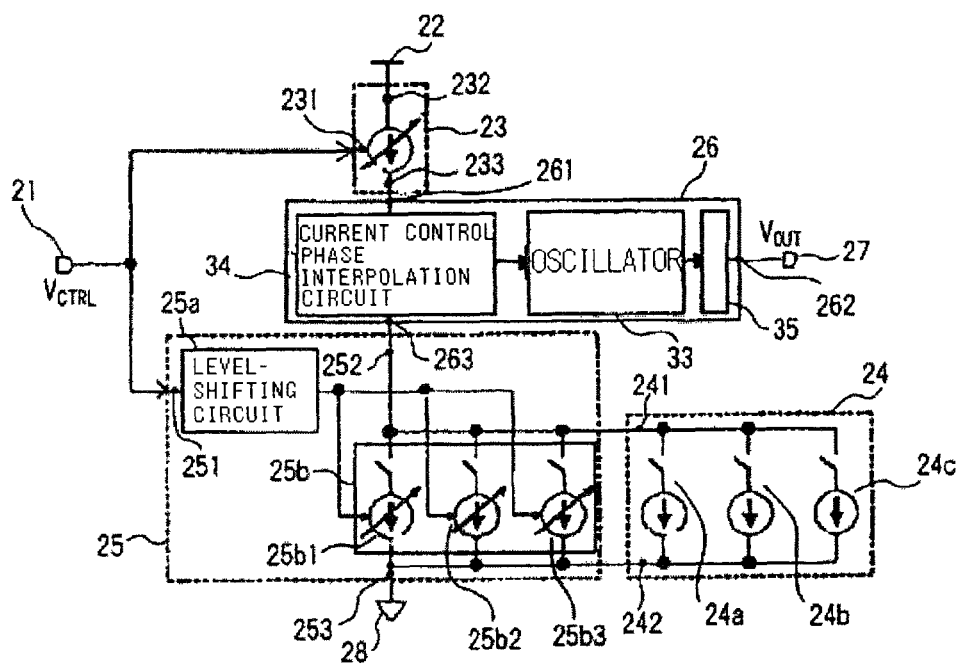
FIG. 16 is a block diagram showing the configuration of a voltage-controlled oscillator of another working example of the present invention.

FIG. 16 is a block diagram showing an example of the configuration of the voltage-controlled oscillator. The following explanation chiefly regards configuration and operations that differ from FIG. 5 and FIG. 10. In FIG. 16, components that are identical to FIG. 5 or FIG. 10 are given the same reference numbers.

Converter 23 is connected between current input terminal 341 of phase interpolation circuit 34 and power-supply terminal 22. Converter 23 causes the flow of current that accords with the input voltage.

Each of switch control current sources 24a to 24c is connected together in parallel between current output terminal 342 of phase interpolation circuit 34 and GND terminal 28.

Each of switch control voltage/current converters 25b1 to 25b3 is connected together in parallel between current output terminal 342 of phase interpolation circuit 34 and GND terminal 28.

Explanation next regards the effects of the present embodiment.

In the present embodiment, converter 23 is connected between current output terminal 341 of phase interpolation circuit 34 and power-supply terminal 22 and allows flow of current that accords with the input voltage. Each of switch control current sources 24a to 24c is connected together in parallel between current output terminal 342 of phase interpolation circuit 34 and GND terminal 28, and allows flow of a constant current when its own switch is ON. Each of switch control voltage/current converters 25b1 to 25b3 is connected together in parallel between current output terminal 342 of phase interpolation circuit 34 and GND terminal 28 and allows flow of current that accords with the input voltage when its own switch is ON.

In this case, each switch of switch control current sources 24a to 24c and switch control voltage/current converters 25b1 to 25b3 can be made up of nMOS transistors and the area of the voltage-controlled oscillator can be reduced. This effect can be realized because an nMOS transistor can achieve the same transconductance as a pMOS transistor in a smaller area.

Explanation next regards a frequency synthesizer that uses a voltage-controlled oscillator.

Figure 17A:
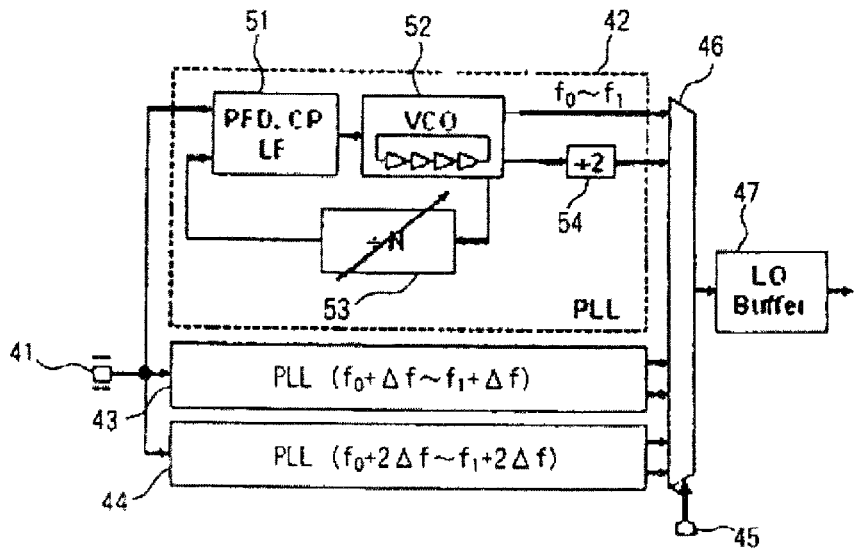
FIG. 17A is a block diagram showing the configuration of a frequency synthesizer of a working example of the present invention.

FIG. 17A is a block diagram showing a frequency synthesizer of an embodiment of the present invention.

In FIG. 17A, the frequency synthesizer includes: input terminal 41, PLL circuits 42 to 44, selection signal input terminal 45, multiplexer circuit 46, and buffer circuit 47. The number of PLL circuits is just three in FIG. 17A, but this number is not actually limited to three and can be any plurality.

Input terminal 41 receives a signal of a reference frequency (hereinbelow referred to as "reference signal") from an outside oscillator (not shown).

PLL circuits 42 to 44 receive the reference signal from input terminal 41.

Each of PLL circuits 42 to 44 includes: input voltage control circuit 51, voltage-controlled oscillation unit 52, variable frequency divider 53, and frequency divider 54.

Input voltage control circuit 51 receives the reference signal from input terminal 41 and receives a comparison signal from variable frequency divider 53. Input voltage control circuit 51 generates a phase difference signal that indicates the phase difference between the frequency of the comparison signal and the reference frequency of the reference signal, and controls the input voltage based on the phase difference signal.

Figure 17B:
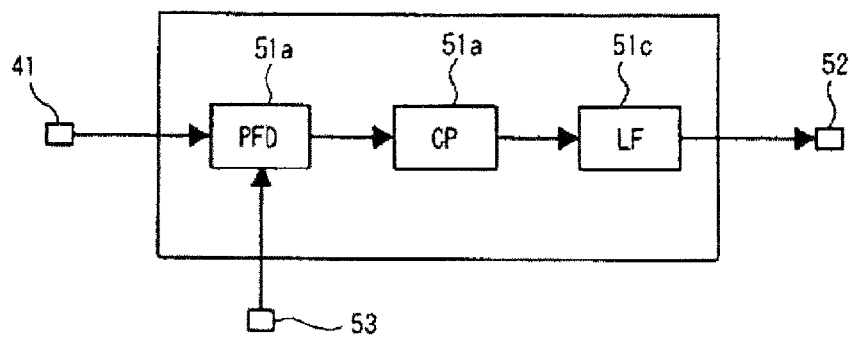
FIG. 17B is a block diagram showing an example of the configuration of an input voltage control circuit.

FIG. 17b is a block diagram showing an example of the configuration of input voltage control circuit 51. In FIG. 17b, input voltage control circuit 51 includes phase comparator 51a, charge pump 51b, and low-pass filter 51c.

Phase comparator 51a compares the falling edge of the comparison signal and the falling edge of the reference signal to detect the phase difference, generates a phase difference signal that indicates a plus phase difference when the phase of the comparison signal is delayed from the phase of the reference signal, and generates a phase difference signal that indicates a minus phase difference when the phase of the comparison signal is advanced from the phase of the reference signal. Phase comparator 51a supplies this phase difference signal to charge pump 51b.

Charge pump 51b increases the input voltage to the degree of increase of the absolute value of the phase difference when the phase difference signal indicates a plus phase difference and reduces the input voltage to the degree of increase of the absolute value of the phase difference when the phase difference signal indicates a minus phase difference.

Low-pass filter 51c smoothes the input voltage.

Returning to FIG. 17a, voltage-controlled oscillation unit 52 in the present embodiment is assumed to be made up by the voltage-controlled oscillator described in FIGS. 2 to 16.

Voltage-controlled oscillation unit 52 of each of PLL circuits 42 to 44 supplies a signal of a frequency within a frequency range that accords with its own PLL circuit (hereinbelow referred to as the "output signal").

For example, the frequency range that accords with PLL circuit 42 is assumed to be the range from a first frequency to a second frequency. In addition, the frequency range that accords with PLL circuit 43 is assumed to be the range from the sum of the first frequency and a prescribed shift frequency to the sum of second frequency and the prescribed shift frequency. The frequency range that accords with PLL circuit 44 is assumed to be the range from the sum of the first frequency and a multiple n of a prescribed shift frequency to the sum of the second frequency and the multiple n of the prescribed shift frequency. The value "n" can be any number but is preferably a natural number. In the present embodiment, "n" is "2."

Variable frequency divider 53 receives the output signal from voltage-controlled oscillation unit 52 and frequency-divides the output signal to generate a comparison signal. Variable frequency divider 53 supplies the comparison signal to phase comparator 51a of input voltage control circuit 51.

Frequency divider 54 receives the output signal from voltage-controlled oscillation unit 52 and carries out one-half frequency division of the output signal. Frequency divider 54 supplies as output the output signal that has undergone one-half-frequency division.

Selection signal input terminal 45 receives a selection signal for controlling the output of MUX circuit (multiplexer circuit) 46.

MUX circuit 46 receives the selection signal from selection signal input terminal 45 and receives the output signals from each of PLL circuits 42 to 44 and the output signal that has undergone one-half-frequency division. MUX circuit 46 supplies any one of the signals that have been received in accordance with the selection signal. MUX circuit is an example of the selection unit.

Buffer circuit 47 receives the signal supplied by MUX circuit 46 and amplifies the signal. Buffer circuit 47 supplies the amplified signal.

Figure 18:
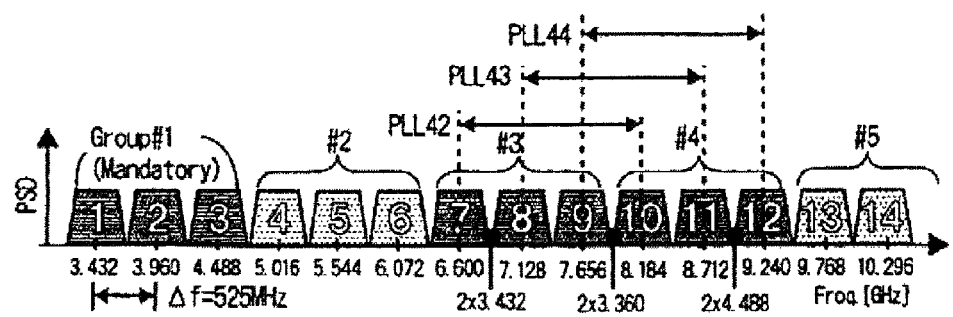
FIG. 18 is an explanatory view showing the variable frequency range of each PLL circuit.

FIG. 18 is an explanatory view showing the variable frequency range of PLL circuits 42 to 44. In FIG. 18, the horizontal axis shows frequency and the vertical axis shows the power spectrum density (PSD). In FIG. 18, explanation regards a case in which the frequency synthesizer is applied to a frequency band plan according to the ultra-wide band (UWB) wireless standards.

Ultra-wide band wireless is one type of a data communication mode that uses spread-spectrum communication and is a data communication mode for carrying out transmission and reception by spreading data over an extremely wide frequency band in the order of 1 GHz and then piling the data on pulses without using a carrier wave.

In an ultra-wide band wireless frequency band plan, frequencies are partitioned into a plurality of frequency bands. In FIG. 18, five frequency bands are shown (Groups #1 to #5). Although the frequency of a signal that is supplied as output requires high-speed hopping within the frequency bands, high-speed hopping is not required between frequency bands.

In order for a frequency synthesizer to supply a signal of a frequency within the frequency range of the third and fourth group (Groups #3 and #4), a voltage-controlled oscillator of a PLL circuit of a frequency synthesizer of the related art needs to have a variable frequency range of from 6600 MHz to 9240 MHz.

The frequency synthesizer of the present embodiment has three PLL circuits that include voltage-controlled oscillators of different variable frequency ranges, and the voltage-controlled oscillator of each PLL circuit therefore does not need to have a variable frequency range of from 6600 MHz to 9240 MHz.

For example, voltage-controlled oscillation unit 52 of PLL circuit 42 may have a variable frequency range of from 6600 MHz to 8184 MHz, voltage-controlled oscillation unit 52 of PLL circuit 43 may have a variable frequency range of from 7128 MHz to 8712 MHz, and voltage-controlled oscillation unit 52 of PLL circuit 44 may have a variable frequency range of from 7656 MHz to 9240 MHz. In the frequency synthesizer of the present embodiment, PLL circuits 42 to 44 further obtain the frequency range of the first group through the use of a signal that has been frequency-divided to one-half by frequency divider 54.

In the present embodiment, voltage-controlled oscillation unit 52 of each of PLL circuits 42 to 44 supplies a signal of a frequency that accords with its own PLL circuit. MUX circuit 46 supplies any one of the signals that are supplied from the PLL circuits.

In this case, when a frequency synthesizer generates a signal of a frequency of a prescribed frequency range, it becomes permissible for the oscillation frequency range of the frequency of the signal supplied from each PLL circuit to be smaller than the prescribed frequency range. As a result, the variable frequency range can be broadened while suppressing an increase in conversion gain.

Explanation next regards a frequency synthesizer that multiplies the reference frequency.

Figure 19:
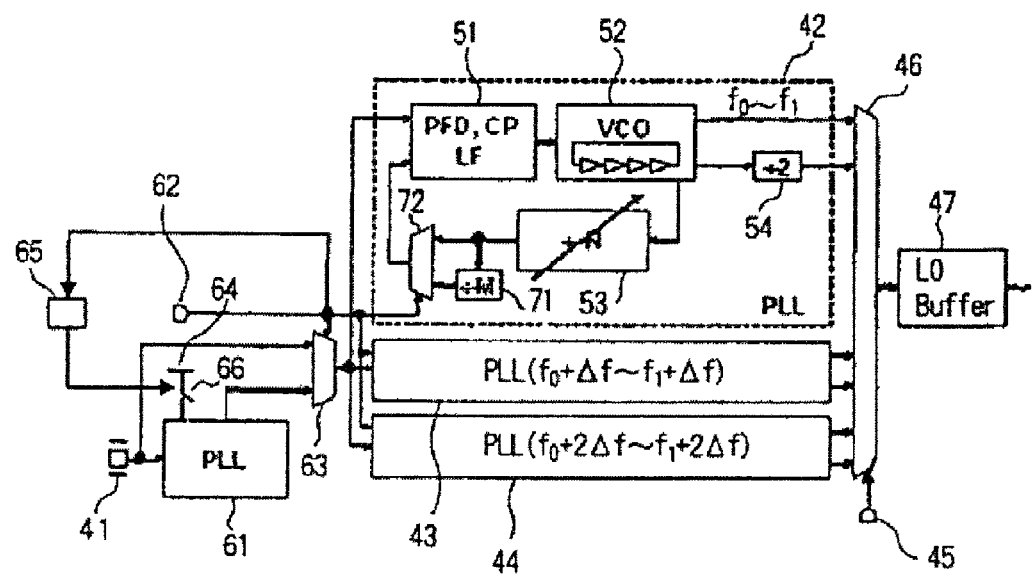
FIG. 19 is a block diagram showing the configuration of a frequency synthesizer of another working example of the present invention.

FIG. 19 is a block diagram showing an example of the configuration of a frequency synthesizer that multiplies the reference frequency. The following explanation chiefly regards the configuration and operations that differ from FIG. 17a. In FIG. 19, components identical to FIG. 17a are given the same reference numbers.

In FIG. 19, the frequency synthesizer further includes, in addition to the configuration shown in FIG. 17a: PLL circuit 61, MUX control terminal 62, MUX circuit 63, power-supply terminal 64, power-supply control circuit 65, and power switch 66. In addition, each of PLL circuits 42 to 44 further includes, in addition to the configuration shown in FIG. 17a: frequency divider 71 and MUX circuit 72.

PLL circuit 61 multiplies the reference signal received from input terminal 41 and supplies the multiplied reference signal (hereinbelow referred to as "multiplied signal") to MUX circuit 63. The multiplication rate of PLL circuit 61 is assumed to be M. In addition, PLL circuit 61 is one example of the multiplier circuit.

MUX control terminal 62 receives a selection control signal for controlling the outputs of MUX circuits 63 and 72.

MUX circuit 63 receives the reference signal from input terminal 41, receives the multiplied signal from PLL circuit 61, and receives the selection control signal from MUX control terminal 62. MUX circuit 63 supplies one of the reference signal and the multiplied signal in accordance with the selection control signal to any one PLL circuits 42 to 44. MUX circuit 63 is an example of the second selection unit.

Power-supply terminal 64 is connected to PLL circuit 61.

Power-supply control circuit 65 supplies power to PLL circuit 61 when MUX control terminal 63 supplies the multiplied signal and halts supply of power to PLL circuit 61 when MUX circuit 63 supplies the reference signal.

For example, power-supply control circuit 65 receives the selection control signal from MUX circuit 62. When this selection indicates that MUX circuit 63 has outputted a reference signal, power-supply control circuit 65 supplies a switch control signal indicating OFF to power switch 66. On the other hand, when this selection control indicates that MUX circuit 63 has outputted a reference signal, power-supply control circuit 65 supplies a switch control signal indicating ON to power switch 66.

Frequency divider 71 receives the comparison signal from variable frequency divider 53 and frequency-divides this comparison signal. Frequency divider 71 supplies the signal obtained by frequency-dividing this comparison signal (hereinbelow referred to as the (frequency-divided signal") to MUX circuit 72. The frequency division ratio of frequency divider 71 is $1/M^{th}$.

MUX circuit 72 receives the comparison signal from variable frequency divider 53, receives the frequency-divided signal from frequency divider 71, and receives the selection control signal from MUX control terminal 62.

MUX circuit 72 supplies one of the comparison signal and the frequency-divided signal according to the selection control signal to input voltage control circuit 51 as a comparison signal. More specifically, MUX circuit 72 supplies the comparison signal to input voltage control circuit 51 when the selection control signal indicates that MUX circuit 63 has outputted a reference signal, and supplies the frequency-divided signal to input voltage control circuit 51 as the comparison signal when the selection control signal indicates output of the multiplied signal by MUX circuit 63.

Explanation next regards the effects of the present embodiment.

In the present embodiment, PLL circuit 61 multiplies the signal of the reference frequency. MUX circuit 63 supplies one of the reference signal and the multiplied signal to PLL circuits 42 to 44. Power-supply control circuit 65 supplies power to PLL circuit 61 when MUX circuit 63 supplies the multiplied signal and halts the supply of power to PLL circuit 61 when MUX circuit 63 supplies the reference signal.

As a result, in a frequency oscillator that can multiply the reference frequency, the power for this multiplication can be reduced.

In the embodiments that have been described hereinabove, the configurations shown in the figures are merely examples, and the present invention is not limited to these configurations. The configuration and details of the invention of the present application are open to various modifications that would be readily understood by one skilled in the art.

What is claimed is:

1. A voltage-controlled oscillator for supplying a signal of a frequency that accords with an input voltage, comprising:
   a converter that converts said input voltage to a first physical quantity that accords with said input voltage;
   an offset adjustment unit that includes a plurality of first switches for offsetting said frequency, said offset adjustment unit generating a second physical quantity that accords with the status of each first switch;
   a linear adjustment unit that includes a plurality of second switches for implementing linear adjustment of the relation between said input voltage and said frequency, said linear adjustment unit, when said input voltage is contained within a prescribed voltage range for implementing linear adjustment of the relation between said input voltage and said frequency, generating a third physical quantity that accords with said input voltage and the status of each second switch; and
   a signal output unit that supplies a signal of a frequency that accords with said first physical quantity, said second physical quantity, and said third physical quantity.

2. The voltage-controlled oscillator according to claim 1, further comprising a switch control circuit that controls each second switch based on said input voltage and said signal.

3. The voltage-controlled oscillator according to claim 1, further comprising a switch control circuit that controls each second switch based on said input voltage, said first physical quantity, said second physical quantity, and said third physical quantity.

4. The voltage-controlled oscillator according to claim 1, wherein said first physical quantity is a first current, said second physical quantity is a second current, and said third physical quantity is a third current.

5. The voltage-controlled oscillator according to claim 4, wherein said linear adjustment unit comprises:
   a level-shifting circuit lowering said input voltage by a prescribed value to generate a level-shifted voltage; and
   an output circuit that generates said third current when said level-shifted voltage is contained within a specific voltage range obtained by lowering said prescribed voltage range by said prescribed value.

6. The voltage-controlled oscillator according to claim 5, further comprising a shift control circuit that controls said prescribed value based on said input voltage and said signal.

7. The voltage-controlled oscillator according to claim 4, wherein said signal output unit comprises:
   an oscillator that oscillates at an amplitude within a prescribed amplitude range; and
   a phase interpolation circuit that adjusts the oscillation frequency of said oscillator based on said first current, said second current, and said third current.

8. The voltage-controlled oscillator according to claim 7, wherein:
   said phase interpolation circuit includes an input terminal for receiving current that flows to said phase interpolation circuit and an output terminal for supplying current that has flowed through said phase interpolation circuit, said phase interpolation circuit adjusting the oscillation frequency of said oscillator according to current flowing to said phase interpolation circuit;
   said converter is connected between a power-supply terminal and said input terminal and allows flow of current that accords with said input voltage;
   a plurality of constant-current circuits connected in parallel between said output terminal and ground terminal are included for causing flow of a constant current when said first switches are ON; and
   said linear adjustment unit includes a plurality of variable current circuits connected together in parallel between said output terminal and said ground terminal for causing flow of current that accords with said input voltage when said second switches are ON.

9. A voltage-controlled oscillator for supplying a signal of a frequency that accords with an input voltage, comprising:
   a converter that converts said input voltage to a first physical quantity that accords with said input voltage;
   an offset adjustment unit that includes a plurality of first switches for offsetting said frequency, said offset adjustment unit generating a second physical quantity that accords with the status of each of the first switches;
   a linear adjustment unit that includes a generation circuit for generating a status value for implementing linear adjustment of the relation between said input voltage and said frequency, said linear adjustment unit generating a third physical quantity that accords with said input voltage and said status value when said input voltage is contained within a prescribed voltage range for implementing linear adjustment of the relation between said input voltage and said frequency; and
   a signal output unit that supplies a signal of a frequency that accords with said first physical quantity, said second physical quantity, and said third physical quantity.

10. A frequency synthesizer, comprising:
a plurality of PLL circuits for supplying a signals of frequencies of different frequency ranges based on a signal of a reference frequency, each PLL circuit including:
a voltage-controlled oscillation unit that supplies a signal of a frequency of a frequency range that accords with that PLL circuit based on an input voltage,
a variable frequency divider for frequency-dividing the signal supplied by said voltage-controlled oscillation unit, and
an input voltage control unit that generates a phase difference signal that indicates the phase difference between said reference frequency and the frequency of a signal that is frequency-divided by said variable frequency divider and that controls said input voltage based on the phase difference signal;
a selection unit that supplies any one of the signals supplied by said PLL circuits;
a multiplier circuit that multiplies a signal of said reference frequency;
a second selection unit for supplying each PLL circuit with one of said signal of the reference frequency and said signal of the multiplied reference frequency; and
a power-supply control unit that supplies power to said multiplier circuit when said second selection unit supplies said signal of multiplied reference frequency and that halts supply of power to said multiplier circuit when said second selection unit supplies said signal of reference frequency.

11. A frequency synthesizer having a plurality of PLL circuits for supplying a signals of frequencies of different frequency ranges based on a signal of a reference frequency; wherein:
each PLL circuit includes:
a voltage-controlled oscillation unit that supplies a signal of a frequency of a frequency range that accords with that PLL circuit based on an input voltage;
a variable frequency divider for frequency-dividing the signal supplied by said voltage-controlled oscillation unit; and
an input voltage control unit that generates a phase difference signal that indicates the phase difference between said reference frequency and the frequency of a signal that is frequency-divided by said variable frequency divider and that controls said input voltage based on the phase difference signal; and
said frequency synthesizer further comprises a selection unit that supplies any one of the signals supplied by said PLL circuits,
wherein said voltage-controlled oscillation unit is constituted by a voltage-controlled oscillator, comprising:
a converter that converts said input voltage to a first physical quantity that accords with said input voltage;
an offset adjustment unit that includes a plurality of first switches for offsetting said frequency, said offset adjustment unit generating a second physical quantity that accords with the status of each first switch;
a linear adjustment unit that includes a plurality of second switches for implementing linear adjustment of the relation between said input voltage and said frequency, said linear adjustment unit, when said input voltage is contained within a prescribed voltage range for implementing linear adjustment of the relation between said input voltage and said frequency, generating a third physical quantity that accords with said input voltage and the status of each second switch; and
a signal output unit that supplies a signal of a frequency that accords with said first physical quantity, said second physical quantity, and said third physical quantity.

12. The frequency synthesizer according to claim 11, wherein voltage-controlled oscillation units included in respective PLL circuits each supply signals of frequencies of mutually different frequency ranges such that signals of frequencies in the frequency range of a first frequency band and a second frequency band of a plurality of frequency bands partitioned in accordance with ultra-wide band wireless standards are supplied as output from said selection unit.

13. The frequency synthesizer according to claim 12, wherein each voltage-controlled oscillation unit contained in a respective PLL circuit supplies as output: a signal of a frequency of a frequency range from the lowest frequency of said first frequency band up to the lowest frequency of said second frequency band, a signal of a frequency of a frequency range from the center frequency of said first frequency band up to the center frequency of said second frequency band, and a signal of a frequency of a frequency range from the highest frequency of said first frequency band up to the highest frequency of said second frequency band.

14. The frequency synthesizer according to claim 13, wherein each of the frequency ranges of signals supplied by each voltage-controlled oscillation unit contained in a respective PLL circuit is shifted in increments of 528 MHz.

15. The frequency synthesizer according to claim 12, wherein:
each PLL circuit contains a frequency divider for frequency-dividing and supplying a signal of a frequency supplied from the voltage-controlled oscillation unit contained in that PLL circuit; and
said selection unit, by supplying any one of the signals supplied from each of the voltage-controlled oscillation unit and frequency divider of each PLL circuit, supplies a signal of a frequency within the frequency range of, among the plurality of frequency bands partitioned according to ultra-wide band wireless standards, a third frequency band that differs from said first frequency band and said second frequency band.

16. A oscillation frequency control method that is carried out by a voltage-controlled oscillator that includes a plurality of first switches for offsetting frequency that accords with an input voltage and a plurality of second switches for implementing linear adjustment of the relation between said input voltage and said frequency and that supplies a signal of said frequency; said oscillation frequency control method comprising:
converting said input voltage to a first physical quantity that accords with said input voltage;
generating a second physical quantity that accords with the status of each first switch;
generating a third physical quantity that accords with said input voltage and the status of each second switch when said input voltage is contained within a prescribed voltage range for linear adjustment of the relation between said input voltage and said frequency; and
supplying a signal of a frequency that accords with said first physical quantity, said second physical quantity, and said the third physical quantity.

17. The oscillation frequency control method according to claim 16, further comprising controlling each second switch based on said input voltage and said signal.

18. The oscillation frequency control method according to claim 16, further comprising controlling each second switch based on said input voltage, said first physical quantity, said second physical quantity, and said third physical quantity.

19. The oscillation frequency control method according to claim 16, wherein said first physical quantity is a first current, said second physical quantity is a second current, and said third physical quantity is a third current.

20. The oscillation frequency control method according to claim 16, wherein said generating further includes:
    lowering said input voltage by a prescribed value to generate a level-shifted voltage; and
    generating said third current when said level-shifted voltage is contained within a specific voltage range obtained by lowering said prescribed voltage range by said prescribed value.

21. The oscillation frequency control method according to claim 20, further comprising controlling said prescribed value based on said input voltage and said signal.

22. An oscillation frequency control method that is carried out by a voltage-controlled oscillator that includes a plurality of first switches for offsetting a frequency that accords with an input voltage and that supplies a signal of said frequency, said oscillation frequency control method comprising:
    converting said input voltage to a first physical quantity that accords with said input voltage;
    generating a second physical quantity that accords with the status of each first switch;
    producing status values for implementing linear adjustment of the relation between said input voltage and said frequency;
    generating a third physical quantity that accords with said input voltage and said status value when said input voltage is contained in a prescribed voltage range for implementing linear adjustment of the relation of said input voltage and said frequency; and
    supplying a signal of a frequency that accords with said first physical quantity, said second physical quantity, and said third physical quantity.

23. An oscillation frequency control method that is carried out by a frequency synthesizer that includes a plurality of PLL circuits for supplying signals of frequencies of different frequency ranges based on a signal of a reference frequency, said oscillation frequency control method comprising:
    a voltage-controlled oscillation step of each PLL circuit supplying a signal of a frequency in a frequency range that accords with that PLL circuit according to the input voltage;
    each PLL circuit frequency-dividing said signal that was supplied as output;
    a phase-difference generation step of each PLL circuit generating a phase difference signal that indicates the phase difference between the frequency of said frequency-divided signal and said reference frequency;
    each PLL circuit controlling said input voltage based on said phase difference signal that was generated; and
    the frequency synthesizer supplying any one of the signals supplied by each PLL circuit,
    wherein frequency synthesizer includes a multiplier circuit that multiplies a signal of said reference frequency and a second selection unit that supplies each PLL circuit with one of said signal of said reference frequency and said signal of reference frequency that was multiplied, and
    wherein said oscillation frequency control method further comprises:
    said frequency synthesizer supplying power to said multiplier circuit when said second selection unit supplies said signal of reference frequency that was multiplied; and
    said frequency synthesizer halting supply of power to said multiplier circuit when said second selection unit supplies said signal of reference frequency.

\* \* \* \* \*